United States Patent
Lu et al.

(10) Patent No.: US 12,010,865 B2
(45) Date of Patent: Jun. 11, 2024

(54) OLED DISPLAY PANEL WITH ORGANIC FUNCTIONAL LAYER, MANUFACTURING METHOD THEREOF, AND OLED DISPLAY DEVICE

(71) Applicant: Wuhan China Star Optoelectronics Semiconductor Display Technology Co., Ltd., Hubei (CN)

(72) Inventors: Rui Lu, Hubei (CN); Cunjun Xia, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 576 days.

(21) Appl. No.: 17/254,340

(22) PCT Filed: Jun. 19, 2020

(86) PCT No.: PCT/CN2020/097027
§ 371 (c)(1),
(2) Date: Dec. 21, 2020

(87) PCT Pub. No.: WO2021/248545
PCT Pub. Date: Dec. 16, 2021

(65) Prior Publication Data
US 2022/0190283 A1 Jun. 16, 2022

(30) Foreign Application Priority Data
Jun. 11, 2020 (CN) .......................... 202010528914.0

(51) Int. Cl.
*H10K 50/844* (2023.01)
*H10K 59/12* (2023.01)
*H10K 71/00* (2023.01)

(52) U.S. Cl.
CPC .......... *H10K 50/844* (2023.02); *H10K 59/12* (2023.02); *H10K 71/00* (2023.02); *H10K 59/1201* (2023.02)

(58) Field of Classification Search
CPC ...... H10K 50/844; H10K 71/00; H10K 59/12; H10K 59/1201
(Continued)

(56) References Cited

U.S. PATENT DOCUMENTS 7,015,640 B2 * 3/2006 Schaepkens .......... B82Y 30/00
313/506
10,381,603 B2 8/2019 Xu et al.
(Continued)

FOREIGN PATENT DOCUMENTS

| CN | 106024842 | 10/2016 |
|---|---|---|
| CN | 106920892 | 7/2017 |

(Continued)

*Primary Examiner* — Eric W Jones

(57) ABSTRACT

An organic light-emitting diode (OLED) display panel, a manufacturing method thereof, and an OLED display device are provided. The OLED display panel disposes an organic functional layer under an encapsulation layer and makes the organic functional layer undergo visible changes when in contact with water and oxygen. Therefore, encapsulation effect can be tested by merely knowing the changes of the organic functional layer, and a test time is shorter. Meanwhile, a minimum distance between boundaries of the organic functional layer and the encapsulation layer is greater than a coating precision accuracy of the encapsulation layer, thereby ensuring the encapsulation effect.

18 Claims, 6 Drawing Sheets

(58) Field of Classification Search
USPC .................................................. 257/40, 59
See application file for complete search history.

(56) References Cited

U.S. PATENT DOCUMENTS

| | | | |
|---|---|---|---|
| 2010/0295759 A1 | 11/2010 | Tanaka | |
| 2011/0151200 A1* | 6/2011 | Erlat | H05B 33/04 427/126.3 |
| 2013/0092972 A1* | 4/2013 | Kim | H10K 50/8445 438/26 |
| 2015/0185142 A1* | 7/2015 | Zeng | H10K 50/841 250/340 |
| 2016/0072099 A1* | 3/2016 | Okamoto | C23C 16/042 118/721 |
| 2017/0271620 A1* | 9/2017 | Kato | H01L 27/12 |
| 2018/0039179 A1* | 2/2018 | Murai | G03F 7/0236 |
| 2018/0123082 A1* | 5/2018 | Sasaki | H10K 50/84 |
| 2018/0253003 A1* | 9/2018 | Furue | G03F 7/0236 |
| 2018/0254435 A1* | 9/2018 | Sasaki | H10K 50/846 |

FOREIGN PATENT DOCUMENTS

| | | |
|---|---|---|
| CN | 107887527 | 4/2018 |
| CN | 109728164 | 5/2019 |
| CN | 110098226 | 8/2019 |
| JP | 2003-157970 | 5/2003 |

* cited by examiner

OLED DISPLAY PANEL WITH ORGANIC FUNCTIONAL LAYER, MANUFACTURING METHOD THEREOF, AND OLED DISPLAY DEVICE

RELATED APPLICATIONS

This application is a National Phase of PCT Patent Application No. PCT/CN2020/097027 having International filing date of Jun. 19, 2020, which claims the benefit of priority of Chinese Patent Application No. 202010528914.0 filed on Jun. 11, 2020. The contents of the above applications are all incorporated by reference as if fully set forth herein in their entirety.

FIELD AND BACKGROUND OF THE INVENTION

The present disclosure relates to the field of display technologies, and more particularly, to an OLED display panel, a manufacturing method thereof, and an OLED display device.

In current display devices, flexible display devices are widely used due to advantages such as light weight, thin thicknesses, bendability, and wide viewing angles. However, organic light-emitting diode (OLED) light-emitting materials are very sensitive to water and oxygen, and the OLED light-emitting materials will lose effectiveness by intrusion of a small amount of water and oxygen, thereby reducing a service life of the flexible display devices. A shown in FIG. 1, current flexible display devices use thin film encapsulation to protect organic devices, but during practical use, it is found that the OLED light-emitting materials will cause dark spots and shrinkage due to poor encapsulation, which represents encapsulation failure. A main occurrence area of the encapsulation failure is a non-light-emitting area. Since there is no organic film layer in the non-light-emitting area to relieve stresses and wrap particles, particles and small holes in an edge area are prone to cause water and oxygen intrusion, thereby causing the encapsulation failure. Meanwhile, since topography of the edge area is more complicated, adhesion between a thin film encapsulation layer and an array layer is poorer, and water and oxygen intrude, thereby causing the encapsulation failure. Therefore, after encapsulation, it is necessary to test encapsulation effect, thereby ensuring the encapsulation effect.

Current technical means for testing the encapsulation effect use testing methods such as high temperature and high humidity storage test, oxygen transmission rate tester, and calcium test method test to indirectly characterize the encapsulation effect. However, these testing methods are time-consuming, not intuitive enough, and not rapid and effective to test the encapsulation effect, so the encapsulation effect of the flexible display devices cannot be better tested.

Therefore, current means for testing the encapsulation effect of the flexible display devices have technical problems of being time-consuming and not intuitive enough.

Technical problem: an embodiment of the present disclosure provides an OLED display panel, a manufacturing method thereof, and an OLED display device to solve the technical problems that current means for testing the encapsulation effect of the flexible display devices are time-consuming and not intuitive enough.

SUMMARY OF THE INVENTION

In order to solve the above problems, the present disclosure provides technical solutions as follows.

An embodiment of the present disclosure provides an OLED display panel which includes:
a substrate;
a drive circuit layer disposed on the substrate;
a light-emitting functional layer disposed on the drive circuit layer; and
an encapsulation layer disposed on the light-emitting functional layer;
wherein in a non-display area of the OLED display panel, an organic functional layer is disposed under the encapsulation layer, a minimum distance between boundaries of the organic functional layer and the encapsulation layer is greater than a coating precision accuracy of the encapsulation layer, and the organic functional layer is configured to undergo visible changes when in contact with water and oxygen.

In some embodiments, the organic functional layer includes a first organic functional layer and color-changing particles disposed in the first organic functional layer, and the color-changing particles are configured to change colors when in contact with water.

In some embodiments, a material of the first organic functional layer includes at least one of acrylate compounds, methacrylate compounds, isoprene compounds, vinyl compounds, epoxy compounds, urethane compounds, cellulose-based compounds, or imide compounds.

In some embodiments, a material of the color-changing particles includes at least one of anhydrous copper sulfate or ferrous salts.

In some embodiments, the organic functional layer includes a second organic functional layer and a first reflective layer, and the second organic functional layer is disposed between the first reflective layer and the encapsulation layer.

In some embodiments, a material of the first reflective layer includes at least one of silver or aluminum.

In some embodiments, a material of the second organic functional layer includes a black organic photoresist.

In some embodiments, the organic functional layer includes a third organic functional layer, a second reflective layer, and color-changing particles disposed in the third organic functional layer, and the color-changing particles are configured to change colors when in contact with water.

Meanwhile, an embodiment of the present disclosure provides a manufacturing method of an OLED display panel. The manufacturing method of the OLED display panel includes following steps:
providing a substrate;
forming a drive circuit layer on the substrate;
forming an organic functional layer on the drive circuit layer in a non-display area of the OLED display panel;
forming a light-emitting functional layer on the drive circuit layer in a display area of the OLED display panel; and
forming an encapsulation layer on the light-emitting functional layer; wherein a minimum distance between boundaries of the organic functional layer and the encapsulation layer is greater than a coating precision accuracy of the encapsulation layer, and the organic functional layer is configured to undergo visible changes when in contact with water and oxygen.

In some embodiments, the step of forming the organic functional layer on the drive circuit layer in the non-display area of the OLED display panel includes forming the organic functional layer on the drive circuit layer by inkjet printing.

In some embodiments, the step of forming the organic functional layer on the drive circuit layer in the non-display area of the OLED display panel includes forming the organic functional layer on the drive circuit layer by exposure and development.

In some embodiments, the step of forming the encapsulation layer on the light-emitting functional layer includes:

forming a first inorganic layer of the encapsulation layer on the light-emitting functional layer by chemical vapor deposition;

forming a first organic layer on the first inorganic layer by inkjet printing; and forming a second inorganic layer of the encapsulation layer on the light-emitting functional layer by chemical vapor deposition.

Meanwhile, an embodiment of the present disclosure provides an OLED display device which includes an OLED display panel and a cover plate. Wherein, the OLED display panel includes:

a substrate;

a drive circuit layer disposed on the substrate;

a light-emitting functional layer disposed on the drive circuit layer; and an encapsulation layer disposed on the light-emitting functional layer;

wherein in a non-display area of the OLED display panel, an organic functional layer is disposed under the encapsulation layer, a minimum distance between boundaries of the organic functional layer and the encapsulation layer is greater than a coating precision accuracy of the encapsulation layer, and the organic functional layer is configured to undergo visible changes when in contact with water and oxygen.

In some embodiments, the organic functional layer includes a first organic functional layer and color-changing particles disposed in the first organic functional layer, and the color-changing particles are configured to change colors when in contact with water.

In some embodiments, a material of the first organic functional layer includes at least one of acrylate compounds, methacrylate compounds, isoprene compounds, vinyl compounds, epoxy compounds, urethane compounds, cellulose-based compounds, or imide compounds.

In some embodiments, a material of the color-changing particles includes at least one of anhydrous copper sulfate or ferrous salts.

In some embodiments, the organic functional layer includes a second organic functional layer and a first reflective layer, and the second organic functional layer is disposed between the first reflective layer and the encapsulation layer.

In some embodiments, a material of the first reflective layer includes at least one of silver or aluminum.

In some embodiments, a material of the second organic functional layer includes a black organic photoresist.

In some embodiments, the organic functional layer includes a third organic functional layer, a second reflective layer, and color-changing particles disposed in the third organic functional layer, and the color-changing particles are configured to change colors when in contact with water.

Beneficial effect: an embodiment of the present disclosure provides an OLED display panel, a manufacturing method thereof, and an OLED display device. The OLED display panel includes a substrate, a drive circuit layer, a light-emitting functional layer, and an encapsulation layer. The drive circuit layer is disposed on the substrate, the light-emitting functional layer is disposed on the drive circuit layer, and the encapsulation layer is disposed on the light-emitting functional layer. Wherein, in a non-display area of the OLED display panel, an organic functional layer is disposed under the encapsulation layer, a minimum distance between boundaries of the organic functional layer and the encapsulation layer is greater than a coating precision accuracy of the encapsulation layer, and the organic functional layer is configured to undergo visible changes when in contact with water and oxygen. By disposing the organic functional layer under the encapsulation layer, the present disclosure makes the organic functional layer undergo visible changes when in contact with water and oxygen. Therefore, encapsulation effect can be tested by merely knowing the changes of the organic functional layer, and a test time is shorter. Meanwhile, the minimum distance between the boundaries of the organic functional layer and the encapsulation layer is greater than the coating precision accuracy of the encapsulation layer, thereby ensuring the encapsulation effect and solving technical problems that current means for testing the encapsulation effect of flexible display devices are time-consuming and not intuitive enough.

DESCRIPTION OF SPECIFIC EMBODIMENTS OF THE INVENTION

The present disclosure provides an OLED display panel, a manufacturing method thereof, and an OLED display device. In order to make the purpose, technical solutions, and effects of this disclosure clearer and more definite, the following further describes this disclosure in detail with reference to the drawings and embodiments. It should be understood that the specific embodiments described herein are only used to explain the disclosure, and are not used to limit the disclosure.

Current means for testing encapsulation effect of flexible display devices have technical problems of being time-consuming and not intuitive enough, and an embodiment of the present disclosure is used to solve the problems.

Figure 1:
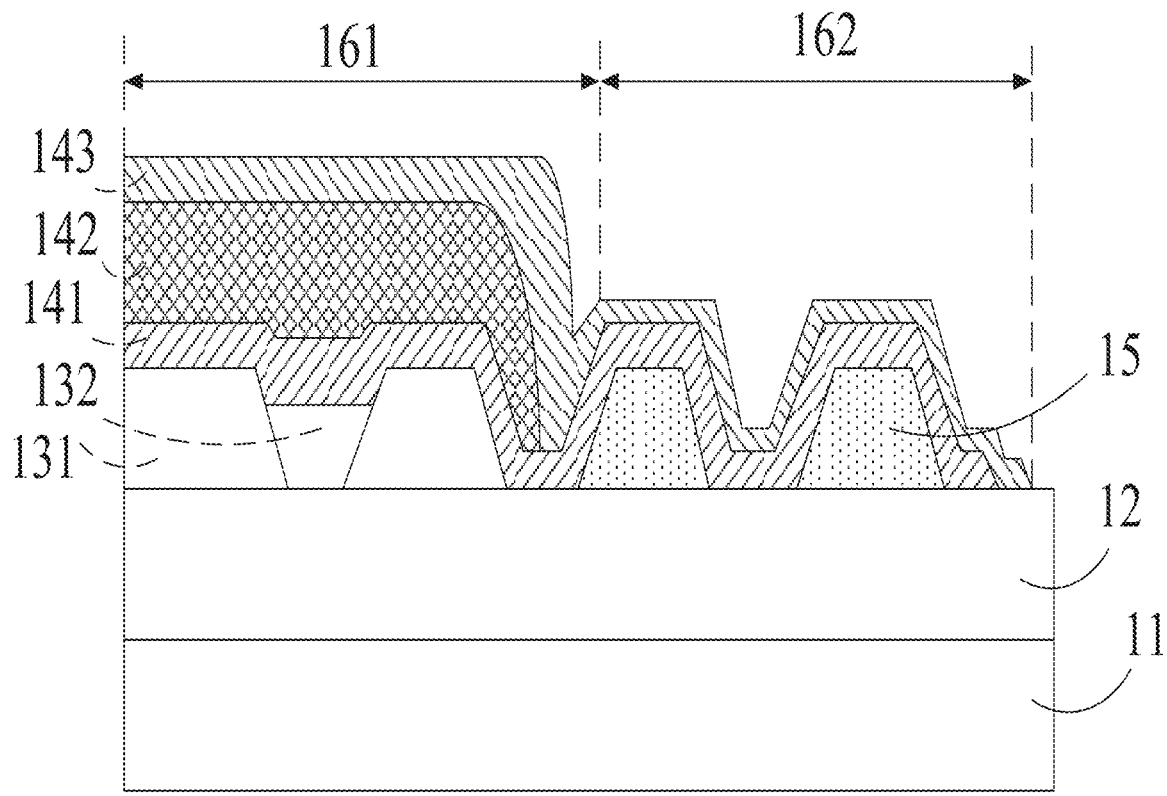
FIG. 1 is a schematic structural diagram of a flexible display device in current technology.

As shown in FIG. 1, a current flexible display device includes a substrate 11, a thin film transistor 12, a light-emitting functional layer 13, and an encapsulation layer 14. The light-emitting functional layer 14 includes a pixel definition layer 131 and a light-emitting material layer 132, the encapsulation layer includes a first inorganic encapsulation layer 11, a first organic layer 142, and a second inorganic encapsulation layer 143, and the flexible display device includes a display area 161 and a non-display area 162. Retaining walls 15 are disposed in the non-display area 162 and are used to prevent the first organic layer from sliding to the non-display area. However, during use of the flexible display device, it is found that OLED light-emitting materials will cause dark spots and shrinkage due to poor encapsulation, which represents encapsulation failure. In addition, it is found that a main occurrence area of the encapsulation failure is the non-display area. Since the encapsulation layer in the non-display area only includes the first inorganic encapsulation layer and the second inorganic encapsulation layer and does not include the first organic layer, stresses cannot be relieved and particles cannot be wrapped in the non-display area, and particles and small holes in an edge area are prone to cause water and oxygen intrusion, thereby causing the encapsulation failure. Meanwhile, since topography of edges of the flexible display device is complicated, adhesion between the encapsulation layer and the thin film transistor is poorer, and water and oxygen intrude, thereby causing the encapsulation failure. Therefore, after encapsulation, it is necessary to perform an encapsulation test. However, current technical means for testing encapsulation effect use methods such as high temperature and high humidity storage test, oxygen transmission rate tester, and calcium test method test to test and characterize the encapsulation effect, which is time-consuming and cannot reflect the encapsulation effect intuitively. That is, current means for testing the encapsulation effect of the flexible display device have technical problems of being time-consuming and not intuitive enough.

Figure 2:
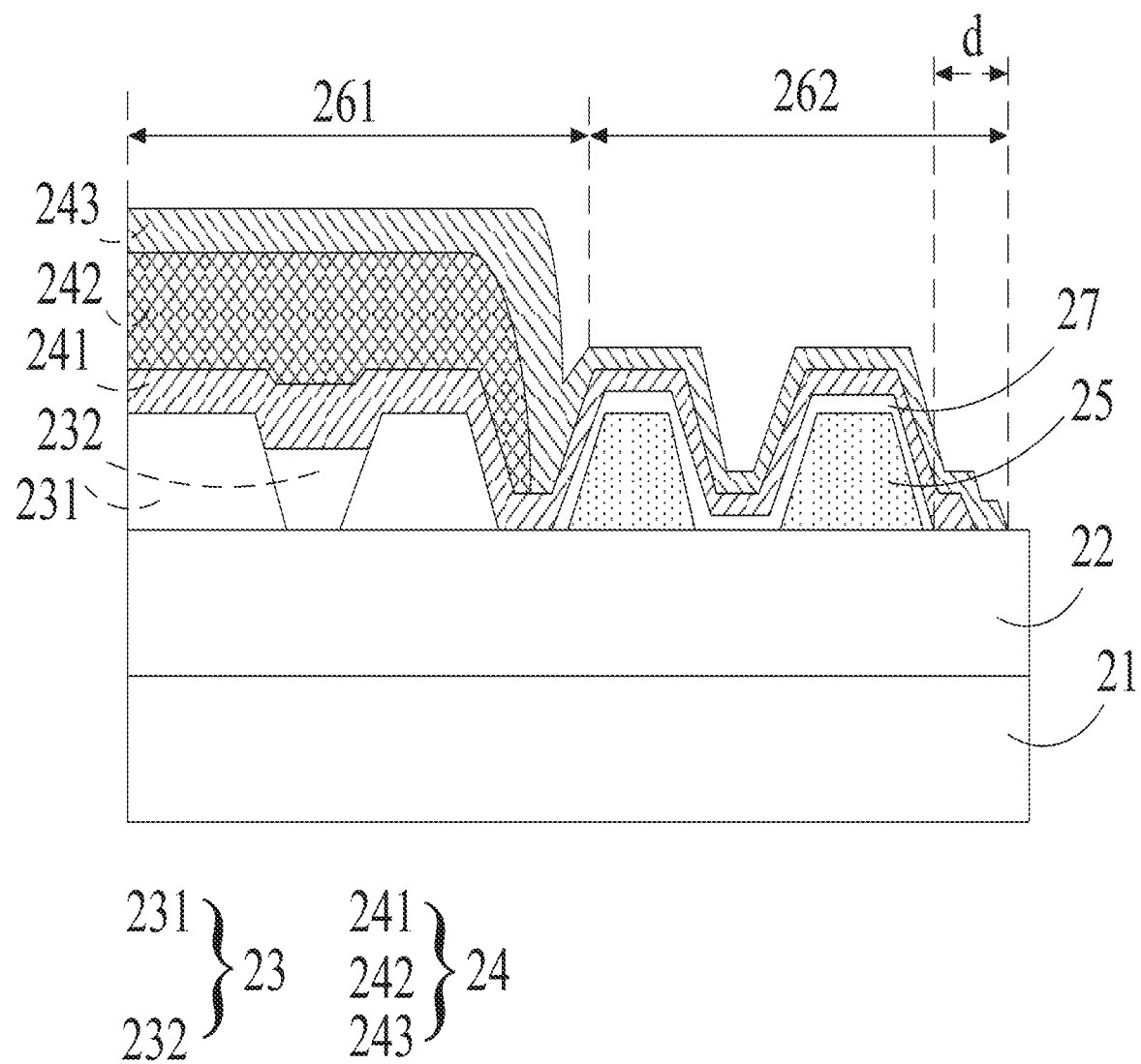
FIG. 2 is a schematic structural diagram of an OLED display panel according to an embodiment of the present disclosure.

As shown in FIG. 2, an embodiment of the present disclosure provides an OLED display panel. The OLED display panel includes:

a substrate 21;

a drive circuit layer 22 disposed on the substrate 21;

a light-emitting functional layer 23 disposed on the drive circuit layer 22; and an encapsulation layer 24 disposed on the light-emitting functional layer 23;

wherein in a non-display area 262 of the OLED display panel, an organic functional layer 27 is disposed under the encapsulation layer 24, a minimum distance d between boundaries of the organic functional layer 27 and the encapsulation layer 24 is greater than a coating precision accuracy of the encapsulation layer, and the organic functional layer 27 is configured to undergo visible changes when in contact with water and oxygen.

This embodiment of the present disclosure provides the OLED display panel. The OLED display panel includes the substrate, the drive circuit layer, the light-emitting functional layer, and the encapsulation layer. The drive circuit layer is disposed on the substrate, the light-emitting functional layer is disposed on the drive circuit layer, and the encapsulation layer is disposed on the light-emitting functional layer. Wherein, in the non-display area of the OLED display panel, the organic functional layer is disposed under the encapsulation layer, the minimum distance between the boundaries of the organic functional layer and the encapsulation layer is greater than the coating precision accuracy of the encapsulation layer, and the organic functional layer is configured to undergo visible changes when in contact with water and oxygen. By disposing the organic functional layer under the encapsulation layer, this embodiment makes the organic functional layer undergo visible changes when in contact with water and oxygen. Therefore, encapsulation effect can be tested by merely knowing the changes of the organic functional layer, and a test time is shorter. Meanwhile, the minimum distance between the boundaries of the organic functional layer and the encapsulation layer is greater than the coating precision accuracy of the encapsulation layer, thereby ensuring the encapsulation effect and solving technical problems that current means for testing the encapsulation effect of flexible display devices are time-consuming and not intuitive enough.

In an embodiment of the present disclosure, a material of the substrate includes polyimide.

In an embodiment of the present disclosure, the drive circuit layer includes an active layer, a first gate insulating layer disposed on the active layer, a first metal layer disposed on the first gate insulating layer, a second gate insulating layer disposed on the first metal layer, a second metal layer disposed on the second gate insulating layer, an interlayer insulating layer disposed on the second metal layer, and a source/drain electrode layer disposed on the interlayer insulating layer.

In an embodiment of the present disclosure, as shown in FIG. 2, the light-emitting functional layer 23 includes a pixel definition layer 231 and an OLED material layer 232. The OLED material layer 232 includes a pixel electrode layer, a light-emitting material layer, and a common electrode layer.

In an embodiment of the present disclosure, as shown in FIG. 2, the encapsulation layer 24 includes a first inorganic layer 241, an organic layer 242, and a second inorganic layer 243, and the OLED display panel includes a display area 261 and the non-display area 262. In order to prevent the organic layer from flowing into the non-display area, retaining walls 25 will be disposed.

Figure 3:
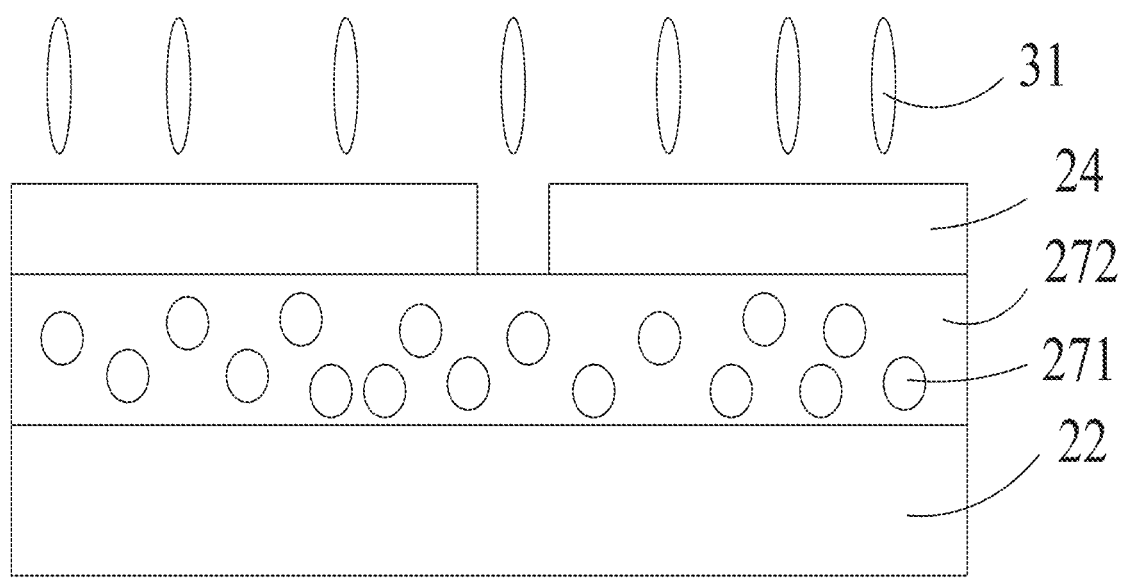
FIG. 3 is a first schematic diagram of an organic functional layer according to an embodiment of the present disclosure.

In an embodiment, as shown in FIG. 3, the organic functional layer 27 includes a first organic functional layer 272 and color-changing particles 271 disposed in the first organic functional layer 272, and the color-changing particles 271 are configured to change colors when in contact with water. The organic functional layer is manufactured using the first organic functional layer and the color-changing particles, as shown in FIG. 3. After the OLED display panel is manufactured, the non-display area can be tested. A specific testing method is to drip water 31 to the non-display area. If the encapsulation effect is not good, and the encapsulation layer has small holes in the non-display area, water drops will enter the organic functional layer from the small holes and then contact with the color-changing particles to make the color-changing particles change colors, which means poor encapsulation. If the encapsulation effect of the encapsulation layer is better, and there is no problem such as the small holes, color-changing particles will not change colors when using water to drip in the non-display area of the OLED display panel, which means good encapsulation.

In an embodiment, a material of the first organic functional layer includes at least one of acrylate compounds, methacrylate compounds, isoprene compounds, vinyl compounds, epoxy compounds, urethane compounds, cellulose-based compounds, or imide compounds.

In an embodiment, a material of the color-changing particles includes at least one of anhydrous copper sulfate or ferrous salts. In a setting process of the color-changing particles, anhydrous copper sulfate can be used as the color-changing particles since anhydrous copper sulfate will turn blue after encountering water. Ferrous salts can also be used as the color-changing particles, for example, ferrous chloride is used as the color-changing particles, and an aqueous solution of ferrous chloride is light green, so it can be judged according to a color change of the color-changing particles. The color-changing particles can also be ferric salts such as ferric chloride.

Figure 4:
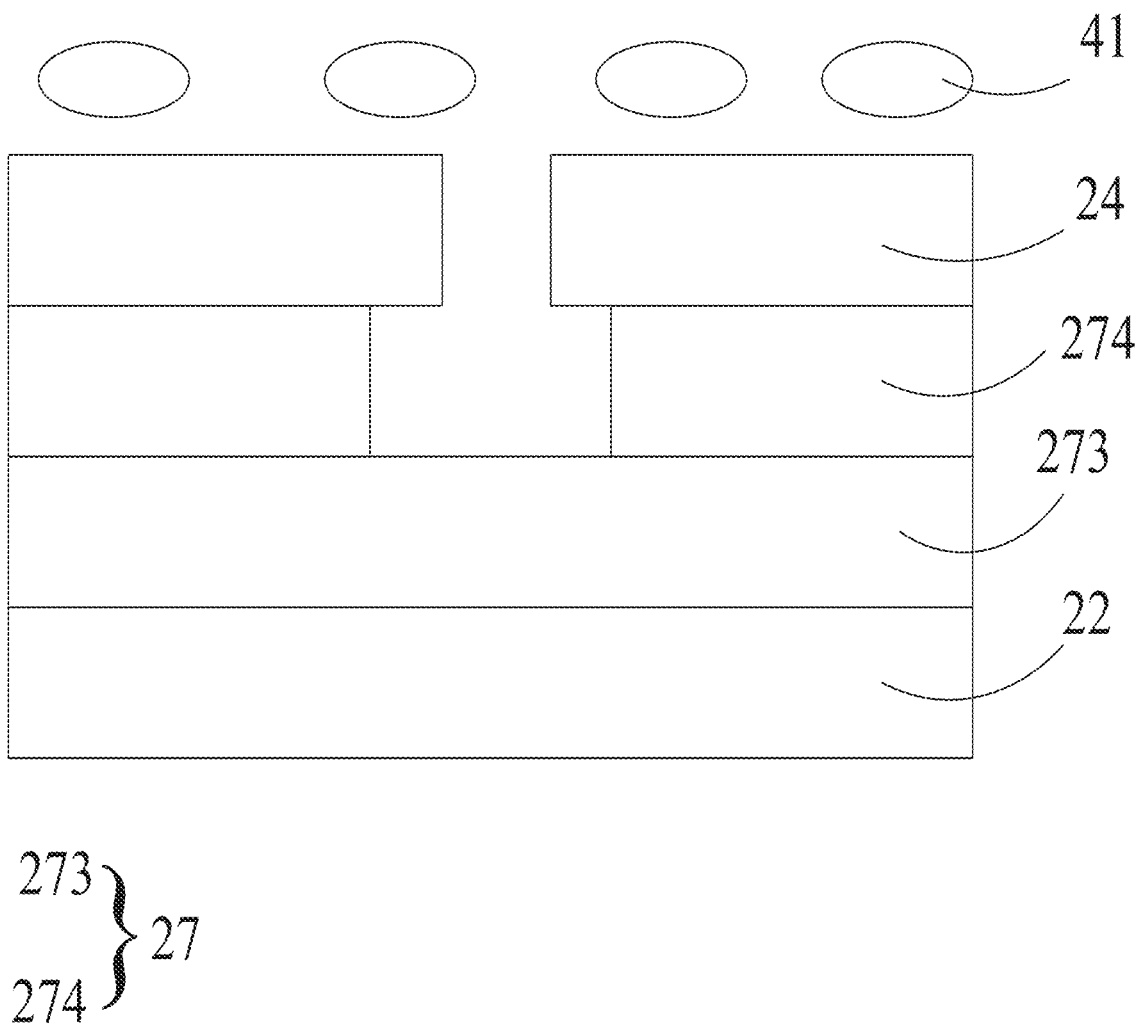
FIG. 4 is a second schematic diagram of the organic functional layer according to an embodiment of the present disclosure.

In an embodiment, as shown in FIG. 4, the organic functional layer 27 includes a second organic functional layer 274 and a first reflective layer 273, and the second organic functional layer 274 is disposed between the first reflective layer 273 and the encapsulation layer 24. The organic functional layer is manufactured using the second organic functional layer and the first reflective layer, as shown in FIG. 4. After the OLED display panel is manufactured, the non-display area is tested. Specifically, oxygen ions 41 are used to test the non-display area. If there are small holes in the encapsulation layer, as shown in FIG. 4, the oxygen ions 41 will etch the second organic functional layer 274 and make holes in the second organic functional layer 274. Therefore, when using laser to irradiate the OLED display panel, the laser will penetrate through the small holes of the encapsulation layer and the holes of the second organic functional layer to arrive at the reflective layer, and then the reflective layer will reflect the laser, so the reflected laser can be detected, which means poor encapsulation effect. If there is no small hole in the encapsulation layer, the reflected laser cannot be obtained when the laser irradiates the non-display area of the OLED display panel, which means better encapsulation effect.

It should be noted that the second organic functional layer in FIG. 4 is an etched second organic functional layer, and the second organic functional layer that is not actually etched is a complete film layer.

In an embodiment, a material of the first reflective layer includes at least one of silver or aluminum. In selection of the material of the first reflective layer, a metal or a metal alloy having better reflection effect can be selected, which may be silver or aluminum.

In an embodiment, a material of the second organic functional layer includes a black organic photoresist. The black organic photoresist is used to manufacture the second organic functional layer, so light will not be scattered by the second organic functional layer and will only be reflected outside by the first reflective layer after penetrating through the second organic functional layer, and then received. Therefore, when there are holes in the second organic functional layer, no light reflection occurring and then causing a misjudgment can be prevented.

In an embodiment, the organic functional layer includes a third organic functional layer, a second reflective layer, and the color-changing particles disposed in the third organic functional layer, and the color-changing particles are configured to change colors when in contact with water. The encapsulation effect of the encapsulation layer can be intuitively tested when using water and oxygen to perform a test by using the third organic functional layer, the second reflective layer, and the color-changing particles to form the organic functional layer, thereby testing the encapsulation effect of the encapsulation layer rapidly and intuitively.

Figure 5:
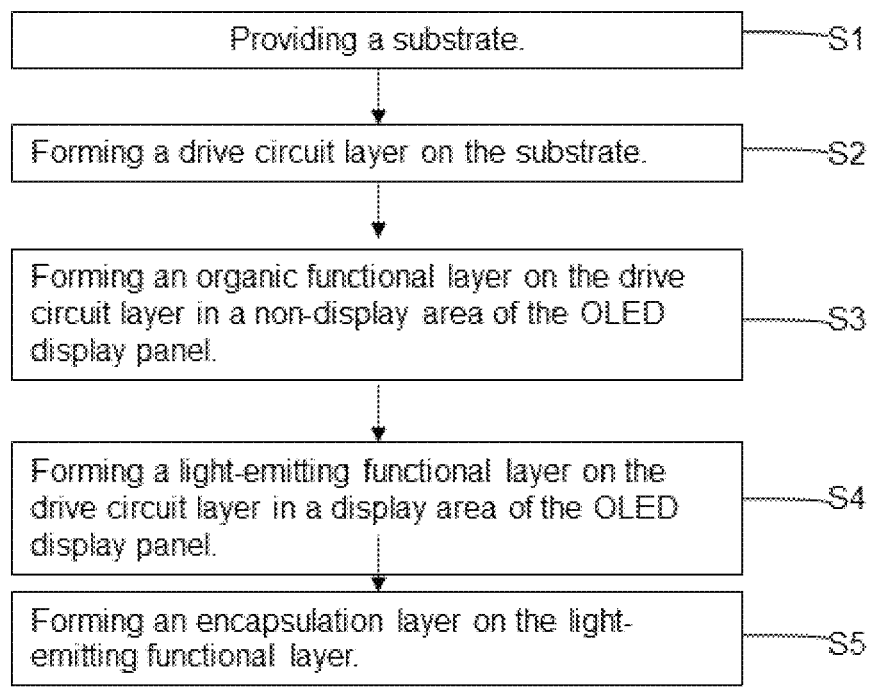
FIG. 5 is a flowchart of a manufacturing method of an OLED display panel according to an embodiment of the present disclosure.

As shown in FIG. 5, an embodiment of the present disclosure provides a manufacturing method of an OLED display panel. The manufacturing method of the OLED display panel includes following steps:

S1: providing a substrate;
S2: forming a drive circuit layer on the substrate;
S3: forming an organic functional layer on the drive circuit layer in a non-display area of the OLED display panel;
S4: forming a light-emitting functional layer on the drive circuit layer in a display area of the OLED display panel; and
S5: forming an encapsulation layer on the light-emitting functional layer; wherein, a minimum distance between boundaries of the organic functional layer and the encapsulation layer is greater than a coating precision accuracy of the encapsulation layer, and the organic functional layer is configured to undergo visible changes when in contact with water and oxygen.

This embodiment of the present disclosure provides the manufacturing method of the OLED display panel. The OLED display panel manufactured by the manufacturing method of the OLED display panel includes the substrate, the drive circuit layer, the light-emitting functional layer, and the encapsulation layer. The drive circuit layer is disposed on the substrate, the light-emitting functional layer is disposed on the drive circuit layer, and the encapsulation layer is disposed on the light-emitting functional layer. Wherein, in the non-display area of the OLED display panel, the organic functional layer is disposed under the encapsulation layer, the minimum distance between the boundaries of the organic functional layer and the encapsulation layer is greater than the coating precision accuracy of the encapsulation layer, and the organic functional layer is configured to undergo visible changes when in contact with water and oxygen. By disposing the organic functional layer under the encapsulation layer, this embodiment makes the organic functional layer undergo visible changes when in contact with water and oxygen. Therefore, encapsulation effect can be tested by merely knowing the changes of the organic functional layer, and a test time is shorter. Meanwhile, the minimum distance between the boundaries of the organic functional layer and the encapsulation layer is greater than the coating precision accuracy of the encapsulation layer, thereby ensuring the encapsulation effect and solving technical problems that current means for testing the encapsulation effect of flexible display devices are time-consuming and not intuitive enough.

In an embodiment, the step of forming the organic functional layer on the drive circuit layer in the non-display area of the OLED display panel includes forming the organic functional layer on the drive circuit layer by inkjet printing.

In an embodiment, the step of forming the organic functional layer on the drive circuit layer in the non-display area of the OLED display panel includes forming the organic functional layer on the drive circuit layer by exposure and development.

In an embodiment, the step of forming the encapsulation layer on the light-emitting functional layer includes:
forming a first inorganic layer of the encapsulation layer on the light-emitting functional layer by chemical vapor deposition;
forming a first organic layer on the first inorganic layer by inkjet printing; and
forming a second inorganic layer of the encapsulation layer on the light-emitting functional layer by chemical vapor deposition.

In an embodiment, the step of forming the encapsulation layer on the light-emitting functional layer includes:
forming a first inorganic layer of the encapsulation layer on the light-emitting functional layer using an atomic layer;
forming a first organic layer on the first inorganic layer by inkjet printing; and
forming a second inorganic layer of the encapsulation layer on the light-emitting functional layer using an atomic layer.

Figure 6:
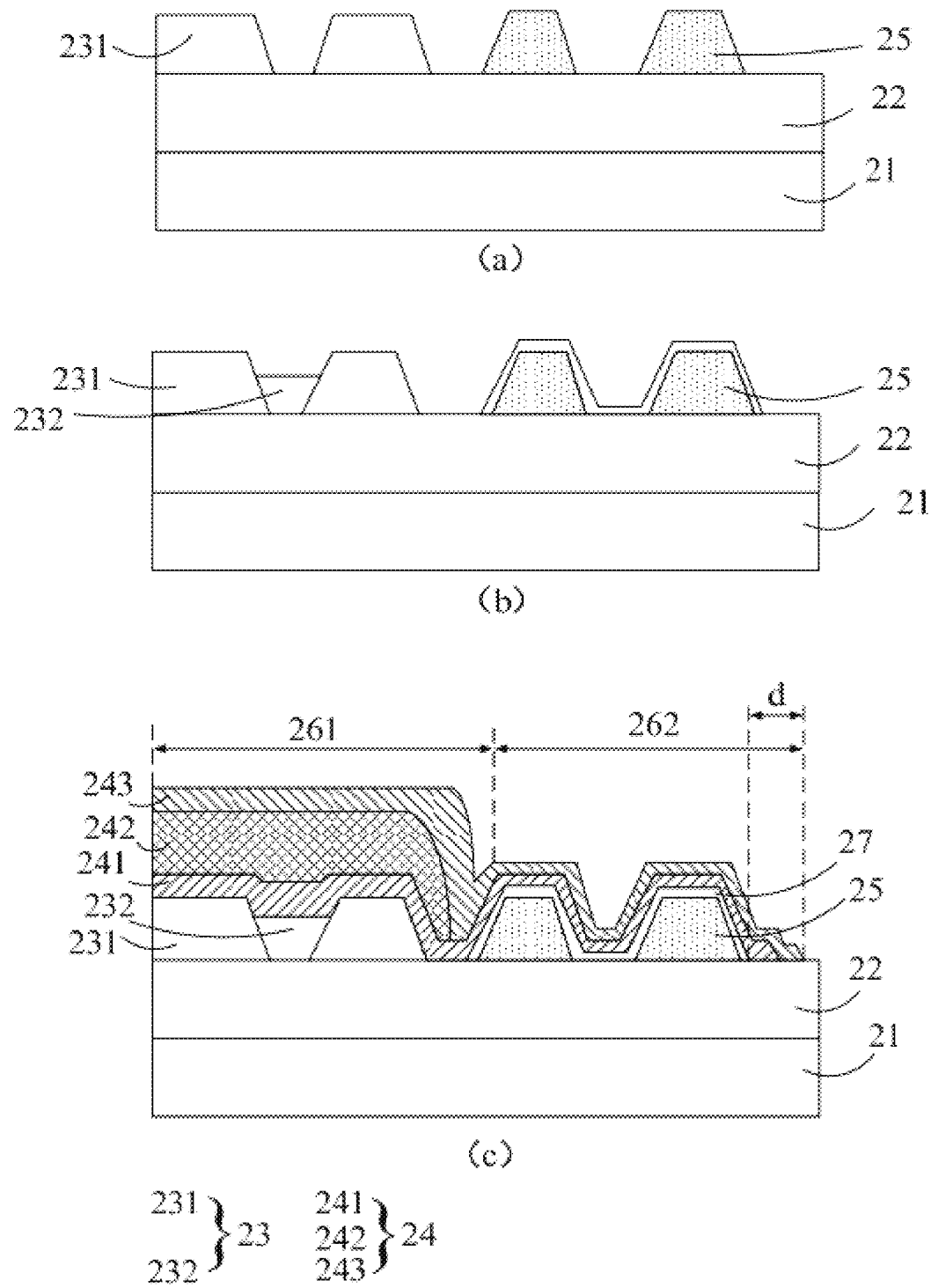
FIG. 6 is a schematic structural diagram of the OLED display panel corresponding to each step of the manufacturing method of the OLED display panel according to an embodiment of the present disclosure.

As shown in FIG. 6, an embodiment of the present disclosure provides a schematic structural diagram of the OLED display panel corresponding to each step of the manufacturing method of the OLED display panel. The OLED display panel formed by providing the substrate, forming the drive circuit layer on the substrate, forming a pixel definition layer on the drive circuit layer, and forming retaining walls in the non-display area is shown in FIG. 6 (a). The OLED display panel subsequently formed by forming the organic functional layer on the retaining walls and forming an OLED material layer in the display area is shown in FIG. 6 (b). The OLED display panel subsequently formed by forming the encapsulation layer on the light-emitting functional layer is shown in FIG. 6 (c).

An embodiment of the present disclosure provides an OLED display device which includes an OLED display panel and a cover plate. Wherein, the OLED display panel includes:

a substrate;
a drive circuit layer disposed on the substrate;
a light-emitting functional layer disposed on the drive circuit layer; and
an encapsulation layer disposed on the light-emitting functional layer;
wherein, in a non-display area of the OLED display panel, an organic functional layer is disposed under the encapsulation layer, a minimum distance between boundaries of the organic functional layer and the encapsulation layer is greater than a coating precision accuracy of the encapsulation layer, and the organic functional layer is configured to undergo visible changes when in contact with water and oxygen.

This embodiment of the present disclosure provides the OLED display device which includes the OLED display panel and the cover plate. The OLED display panel includes the substrate, the drive circuit layer, the light-emitting functional layer, and the encapsulation layer. The drive circuit layer is disposed on the substrate, the light-emitting functional layer is disposed on the drive circuit layer, and the encapsulation layer is disposed on the light-emitting functional layer. Wherein, in the non-display area of the OLED display panel, the organic functional layer is disposed under the encapsulation layer, the minimum distance between the boundaries of the organic functional layer and the encapsulation layer is greater than the coating precision accuracy of the encapsulation layer, and the organic functional layer is configured to undergo visible changes when in contact with water and oxygen. By disposing the organic functional layer under the encapsulation layer, this embodiment makes the organic functional layer undergo visible changes when in contact with water and oxygen. Therefore, encapsulation effect can be tested by merely knowing the changes of the organic functional layer, and a test time is shorter. Meanwhile, the minimum distance between the boundaries of the organic functional layer and the encapsulation layer is greater than the coating precision accuracy of the encapsulation layer, thereby ensuring the encapsulation effect and solving technical problems that current means for testing the encapsulation effect of flexible display devices are time-consuming and not intuitive enough.

In an embodiment, in the OLED display device, the organic functional layer includes a first organic functional layer and color-changing particles disposed in the first organic functional layer, and the color-changing particles are configured to change colors when in contact with water.

In an embodiment, in the OLED display device, a material of the first organic functional layer includes at least one of acrylate compounds, methacrylate compounds, isoprene compounds, vinyl compounds, epoxy compounds, urethane compounds, cellulose-based compounds, or imide compounds.

In an embodiment, in the OLED display device, a material of the color-changing particles includes at least one of anhydrous copper sulfate or ferrous salts.

In an embodiment, in the OLED display device, the organic functional layer includes a second organic functional layer and a first reflective layer, and the second organic functional layer is disposed between the first reflective layer and the encapsulation layer.

In an embodiment, in the OLED display device, a material of the first reflective layer includes at least one of silver or aluminum.

In an embodiment, in the OLED display device, a material of the second organic functional layer includes a black organic photoresist.

In an embodiment, in the OLED display device, the organic functional layer includes a third organic functional layer, a second reflective layer, and the color-changing particles disposed in the third organic functional layer, and the color-changing particles are configured to change colors when in contact with water.

It can be known according to the above embodiments:

The embodiments of the present disclosure provide the OLED display panel, the manufacturing method thereof, and the OLED display device. The OLED display panel includes the substrate, the drive circuit layer, the light-emitting functional layer, and the encapsulation layer. The drive circuit layer is disposed on the substrate, the light-emitting functional layer is disposed on the drive circuit layer, and the encapsulation layer is disposed on the light-emitting functional layer. Wherein, in the non-display area of the OLED display panel, the organic functional layer is disposed under the encapsulation layer, the minimum distance between the boundaries of the organic functional layer and the encapsulation layer is greater than the coating precision accuracy of the encapsulation layer, and the organic functional layer is configured to undergo visible changes when in contact with water and oxygen. By disposing the organic functional layer under the encapsulation layer, this embodiment makes the organic functional layer undergo visible changes when in contact with water and oxygen. Therefore, encapsulation effect can be tested by merely knowing the changes of the organic functional layer, and a test time is shorter. Meanwhile, the minimum distance between the boundaries of the organic functional layer and the encapsulation layer is greater than the coating precision accuracy of the encapsulation layer, thereby ensuring the encapsulation effect and solving technical problems that current means for testing the encapsulation effect of flexible display devices are time-consuming and not intuitive enough.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:
1. An organic light-emitting diode (OLED) display panel, comprising:
 a substrate;
 a drive circuit layer disposed on the substrate;
 a light-emitting functional layer disposed on the drive circuit layer; and
 an encapsulation layer comprising a first inorganic layer, a first organic layer and a second inorganic layer sequentially disposed on the light-emitting functional layer;

wherein the first organic layer is disposed only in a display area of the OLED display panel;

wherein in a non-display area of the OLED display panel, an organic functional layer is disposed under the encapsulation layer, a minimum distance between boundaries of the organic functional layer and the encapsulation layer is greater than a coating precision accuracy of the encapsulation layer, and the organic functional layer is configured to undergo visible changes when in contact with water and oxygen wherein the first organic layer in the display area is separated from the organic functional layer in the non-display area by the first inorganic layer and the second inorganic layer; and wherein the organic functional layer comprises a first organic functional layer and a first reflective layer, and the first organic functional layer is disposed between the first reflective layer and the encapsulation layer.

2. The OLED display panel according to claim 1, wherein the organic functional layer comprises a first organic functional layer and color-changing particles disposed in the first organic functional layer, and the color-changing particles are configured to change colors when in contact with water.

3. The OLED display panel according to claim 2, wherein a material of the first organic functional layer comprises at least one of acrylate compounds, methacrylate compounds, isoprene compounds, vinyl compounds, epoxy compounds, urethane compounds, cellulose-based compounds, or imide compounds.

4. The OLED display panel according to claim 2, wherein a material of the color-changing particles comprises at least one of anhydrous copper sulfate or ferrous salts.

5. The OLED display panel according to claim 1, wherein a material of the first reflective layer comprises at least one of silver or aluminum.

6. The OLED display panel according to claim 1, wherein a material of the first organic functional layer comprises a black organic photoresist.

7. The OLED display panel according to claim 1, wherein the organic functional layer comprises a first organic functional layer, a first reflective layer, and color-changing particles disposed in the first organic functional layer, and the color-changing particles are configured to change colors when in contact with water.

8. A manufacturing method of an organic light-emitting diode (OLED) display panel, comprising following steps:
providing a substrate;
forming a drive circuit layer on the substrate;
forming an organic functional layer on the drive circuit layer in a non-display area of the OLED display panel;
forming a light-emitting functional layer on the drive circuit layer in a display area of the OLED display panel; and
forming an encapsulation layer comprising a first inorganic layer, a first organic layer and a second inorganic layer sequentially on the light-emitting functional layer; wherein a minimum distance between boundaries of the organic functional layer and the encapsulation layer is greater than a coating precision accuracy of the encapsulation layer, and the organic functional layer is configured to undergo visible changes when in contact with water and oxygen;
wherein the first organic layer is disposed only in a display area of the OLED display panel;
wherein the first organic layer in the display area is separated from the organic functional layer in the non-display area by the first inorganic layer and the second inorganic layer; and wherein the organic functional layer comprises a first organic functional layer and a first reflective layer, and the first organic functional layer is disposed between the first reflective layer and the encapsulation layer.

9. The manufacturing method of the OLED display panel according to claim 8, wherein the step of forming the organic functional layer on the drive circuit layer in the non-display area of the OLED display panel comprises forming the organic functional layer on the drive circuit layer by inkjet printing.

10. The manufacturing method of the OLED display panel according to claim 8, wherein the step of forming the organic functional layer on the drive circuit layer in the non-display area of the OLED display panel comprises forming the organic functional layer on the drive circuit layer by exposure and development.

11. The manufacturing method of the OLED display panel according to claim 8, wherein the step of forming the encapsulation layer on the light-emitting functional layer comprises:
forming a first inorganic layer of the encapsulation layer on the light-emitting functional layer by chemical vapor deposition;
forming a first organic layer on the first inorganic layer by inkjet printing; and
forming a second inorganic layer of the encapsulation layer on the light-emitting functional layer by chemical vapor deposition.

12. An organic light-emitting diode (OLED) display device, comprising an OLED display panel and a cover plate, wherein the OLED display panel comprises:
a substrate;
a drive circuit layer disposed on the substrate;
a light-emitting functional layer disposed on the drive circuit layer; and
an encapsulation layer comprising a first inorganic layer, a first organic layer and a second inorganic layer sequentially disposed on the light-emitting functional layer;
wherein the first organic layer is disposed only in a display area of the OLED display panel;
wherein in a non-display area of the OLED display panel, an organic functional layer is disposed under the encapsulation layer, a minimum distance between boundaries of the organic functional layer and the encapsulation layer is greater than a coating precision accuracy of the encapsulation layer, and the organic functional layer is configured to undergo visible changes when in contact with water and oxygen
wherein the first organic layer in the display area is separated from the organic functional layer in the non-display area by the first inorganic layer and the second inorganic layer; and
wherein the organic functional layer comprises a first organic functional layer and a first reflective layer, and the first organic functional layer is disposed between the first reflective layer and the encapsulation layer.

13. The OLED display device according to claim 12, wherein the organic functional layer comprises a first organic functional layer and color-changing particles disposed in the first organic functional layer, and the color-changing particles are configured to change colors when in contact with water.

14. The OLED display device according to claim 13, wherein a material of the first organic functional layer comprises at least one of acrylate compounds, methacrylate compounds, isoprene compounds, vinyl compounds, epoxy compounds, urethane compounds, cellulose-based compounds, or imide compounds.

15. The OLED display device according to claim 13, wherein a material of the color-changing particles comprises at least one of anhydrous copper sulfate or ferrous salts.

16. The OLED display device according to claim 12, wherein a material of the first reflective layer comprises at least one of silver or aluminum.

17. The OLED display device according to claim 12, wherein a material of the first organic functional layer comprises a black organic photoresist.

18. The OLED display device according to claim 12, wherein the organic functional layer comprises a first organic functional layer, a first reflective layer, and color-changing particles disposed in the first organic functional layer, and the color-changing particles are configured to change colors when in contact with water.

* * * * *